United States Patent
Rethman et al.

(10) Patent No.: US 6,654,713 B1
(45) Date of Patent: Nov. 25, 2003

(54) METHOD TO COMPRESS A PIECEWISE LINEAR WAVEFORM SO COMPRESSION ERROR OCCURS ON ONLY ONE SIDE OF THE WAVEFORM

(75) Inventors: Nicholas L. Rethman, North Andover, MA (US); Nevine Nassif, Arlington, MA (US); William J. Grundmann, Westborough, MA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/447,019

(22) Filed: Nov. 22, 1999

(51) Int. Cl.[7] .............................................. G06F 17/50
(52) U.S. Cl. ................................ 703/19; 703/2; 703/5; 703/14
(58) Field of Search ............................ 703/2, 5, 14, 19

(56) References Cited

U.S. PATENT DOCUMENTS

| | | | | |
|---|---|---|---|---|
| 4,513,444 A | * | 4/1985 | Okai et al. .................... | 382/242 |
| 5,245,679 A | * | 9/1993 | Rosenberg .................... | 382/232 |
| 5,347,478 A | * | 9/1994 | Suzuki et al. ................. | 708/203 |
| 5,353,359 A | * | 10/1994 | Urabe et al. ................... | 382/242 |
| 5,388,182 A | * | 2/1995 | Benedetto et al. ............. | 704/205 |
| 5,623,935 A | * | 4/1997 | Faisandier ..................... | 600/509 |
| 5,691,769 A | * | 11/1997 | Kim ......................... | 375/240.18 |
| 5,694,331 A | * | 12/1997 | Yamamoto et al. ............ | 345/428 |
| 5,727,085 A | * | 3/1998 | Toyama et al. ................ | 382/232 |
| 5,751,771 A | * | 5/1998 | Katsumata et al. ............. | 375/240 |
| 5,881,183 A | * | 3/1999 | Lee .............................. | 382/288 |
| 5,978,512 A | * | 11/1999 | Kim ............................ | 382/241 |
| 6,393,159 B1 | * | 5/2002 | Prasad et al. ................. | 382/259 |
| 6,438,266 B1 | * | 8/2002 | Bajaj et al. ................... | 382/243 |

FOREIGN PATENT DOCUMENTS

| | | | | |
|---|---|---|---|---|
| WO | WO 98/47247 | * | 10/1998 | H04B/14/06 |

OTHER PUBLICATIONS

"MPEG–4 Rate–Distortion–Based Shape–Coding Techniques", A.K. Katsaggelos, Proceedings of the IEEE, vol. 86, NO. 6, Jun. 1998.*
"Lossy Compression of Images Using Piecewise–Linear Approximation" V. Bhaskaran, White Paper, Hewlett–Packard Labs, Nov. 1995.*
A Pereptual Organization Approach to contour Estimation via Composition, Compression, and Pruning of Contour Hypotheses S. Casadei, MURI Grant DAAH04–96–1–0445, Apr. 1998.*

* cited by examiner

Primary Examiner—Hugh Jones
Assistant Examiner—Fred Ferris

(57) ABSTRACT

A method of data compression for continuous or piecewise linear curves in two variables is presented which can guarantee that any compression error is exclusively on one selected side of the curve. Limiting errors to one side is required when simulating integrated circuit performance to determine if a design will have speed-related problems. In such a simulation it is necessary to calculate both the minimum and maximum possible time delays for a logic chain of circuit elements. Data compression of the transistor or gate voltage versus time relationship is necessary to reduce the very large amount of data that is required for the simulation. Data compression may introduce errors into the data in either direction. If it is necessary to have any possible error confined to one side of the curve, the compressed data must be shifted toward the desired error side by at least the maximum possible data error. This shifting increases the total error between the compressed data and reality by more than is acceptable in current simulations. The present method approximates the data curve with piecewise linear segments all of which are on a selected side of the curve, for example the late side. This avoids increasing the error between the data curve and the stored approximation due to shifting of the stored data to ensure that all points are on the selected side.

31 Claims, 6 Drawing Sheets

METHOD TO COMPRESS A PIECEWISE LINEAR WAVEFORM SO COMPRESSION ERROR OCCURS ON ONLY ONE SIDE OF THE WAVEFORM

BACKGROUND OF THE INVENTION

During the design of silicon integrated circuits (ICs), a method is needed to verify that the circuit design will work at the required clocking speed before the IC is manufactured. This is necessary because the time delay in verifying that a design is too slow for its intended application by waiting for actual ICs to be fabricated results in a product that may be many months late coming into the market. Arriving late into the electronic market place frequently results in lower prices for an electronic component, and in lower market share, both typically causing reduced earnings.

One known method of verifying the functionality at operating speed of an IC design is to use what is known as a min max static timing verifier. Examples of commercial timing verifiers include Path Mill by Synopsis, Inc., Pearl by Cadence, Inc., and Veritime by Cadence Inc. Typical timing verifiers work by calculating the minimum possible time delay and the maximum possible time delay for a logic signal traversing a circuit path comprised of transistors or logic gate, and labeling any path that does not meet the required timing limits or constraints.

Within any of the known timing verifiers there are many different techniques for calculating the logic signal propagation delay along a circuit path of interest. Typically the circuit path is broken down into smaller and more easily calculated sections, for example, individual logic gates such as NAND gates, NOR gates, inverters, and channel connected regions (CCR). The logic delay for the circuit path is then simply the sum of all of the delays for the individual parts. The delays used by the timing verification tools for the NAND, NOR, inverters and CCRs are typically computed from characterization for delay models. These models characterize the delay and voltage transitions for each output of each given gate or CCR in a circuit path. If the total computed path delay results in a design violation along the circuit path of interest, then the designer will employ more accurate delay estimation methods to verify the path performance before potentially redesigning the circuit path. Commonly designers will use a circuit simulation tool, such as SPICE, Timing Mill by Synopsis, Inc., Starsim by Avant!, Inc., and ASX by IBM, Inc., as the accurate delay estimator tool for the circuit logic element, such as a NAND gate, CCR, or for the entire circuit path. In certain instances the timing verifier may be able to directly invoke the circuit simulator tool.

The circuit simulation tool produces a behavior model for the circuit that is represented as a waveform. These waveforms must be stored in a memory device for later use. Since memory resources are expensive, it is beneficial to provide a method for compressing the waveform data. Since minimum delay and maximum delay estimations are required by timing verifiers, known as min/max sides, then two waveforms may have to be stored, one for the minimum delay or fast estimations (known as early signals) and one for the maximum delay or slow estimations (known as late signals).

The waveforms just discussed are an example of typical two variable curves, in this particular case voltage versus elapsed time. To reduce the amount of data that needs to be stored, the voltage versus time curve maybe expressed as a series of voltage values at a series of evenly spaced time intervals. The more time intervals recorded (i.e., the shorter the time interval), the more accurately the stored compressed data approaches the original.

Limiting errors to one side of a curve is required when simulating integrated circuit performance to determine if a design will have speed related problems. In such a simulation it is necessary to calculate both the minimum and maximum possible time delays for a logic chain of circuit elements. Data compression of the transistor or logic gate voltage versus time relationship is necessary to reduce the very large amount of data that is produced by the simulation. Data compression may introduce errors into the data in either direction, i.e., either to the fast operating side or to the late side. Since it is necessary to have all possible error confined to the slow (i.e., late) side of the curve when calculating the maximum delay, or to the fast (i.e., early) side of the curve when calculating the minimum delay for the logic chain, the compressed data must be shifted in the desired direction by the maximum possible data error in order to ensure that all of the compressed data points are either early, or late. This shifting increases the total error between the compressed data and the original waveform by more than is acceptable in current calculation tools.

SUMMARY OF THE INVENTION

Therefore, it would solve a problem in the art to provide a method or a tool for ensuring that all of the data compression error in a timing verifier tool is confined to a selected side of the curve, since with such a method there would be no need to shift the compressed data by an amount equal to the maximum error toward the desired region, and no consequent increase in error introduced by the compression.

A method of data compression for open curves in two variables is presented which can guarantee that any compression error is exclusively on one selected side of the curve. In the example of a circuit model waveform, the variables are voltage and time, or current and time, etc., and the area to the right of the curve (i.e., increasing time) is the slow (or late) side. The method requires inputs to define a beginning point, an ending point, an accuracy limit, and the side to which the error is to be confined.

The curve is divided into rising and falling segments, and into curve sections, each of which is either convex shaped or concave shaped toward, for example, the late side. On convex sections of the curve, the compression method draws a tangent to the curve at the beginning point and calculates the difference between the tangent line and the curve until the difference reaches a predetermined accuracy value. A new tangent line is drawn to the curve at the point where the deviation from the original tangent reaches the limit, and the intersection point of the two tangents is stored in memory. This process is repeated until the end point of the convex segment is reached, where another tangent is drawn to conclude the convex section approximation and data compression, and to begin the concave curve section approximation and data compression. The convex portion of the curve has been thus been approximated by a piecewise linear set of lines connecting the intersection points of the tangent lines drawn on the selected side of the curve, and none of the points on the piecewise set of lines is ever on the opposite side of the original curve.

The concave section approximation continues the tangent line drawn at the inflection point between the convex and concave sections of the curve, until the deviation in value exceeds the accuracy value. A new tangent line is constructed at the point on the curve where the deviation exceeded the set accuracy and the intersection point of the two tangent lines is found. The angle between the two tangent lines is calculated and bisected, and a perpendicular line to the bisecting line is constructed. The intersection point between the perpendicular line and the original curve is stored in memory. Thus the concave section of the curve has been approximated by a piecewise linear set of lines connecting the points of the original curve that are nearest to the intersection of the tangent lines. Since the points are all on the original curve and the segment is concave, then every point on the piecewise linear set of lines is on the opposite side of the original curve from the tangent lines, and all points are on the selected side of the curve.

The curve or waveform maybe divided into rising and falling segments by using the predefined beginning and ending points, and all locations on the curve having a first derivative equal to zero, i.e., being horizontal. A falling segment may be followed by either another falling segment or by a rising segment. One method of determining whether a segment is rising or falling is to measure the difference in the value of the curve at the beginning point of the segment and at the end point, where either beginning or ending points of a segment may be locations where the curve is horizontal. Another method of determining whether a segment is rising or falling is to examine the first derivative of the curve. A falling curve has negative slope and a negative derivative.

The inflection points that divide the rising and falling segments of the original curve into convex and concave sections may be found by calculating the second derivative of the curve function and setting it equal to zero. Between the beginning point of a curve section and the point where the second derivative equals zero, the curve section will be either convex toward the selected side or concave. The first derivative will be negative for a falling curve segment, and the change in the value of the first derivative while traversing the curve toward the right will be more negative for a convex right falling curve, and more positive for a concave right curve. The opposite is true for rising curve segments. Another way of looking at this is that the value of the second derivative will be negative for a convex right falling curve, and positive for a concave right falling curve.

The described method is useful for data compression of any open curve or waveform in two variables. This means that the curve may not have any loops that cause intersections between portions of the curve. The curve may be a continuous function or a piecewise linear curve. There may be numerous changes in direction of the curve, such as glitches or overshoots in voltage versus time waveforms.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
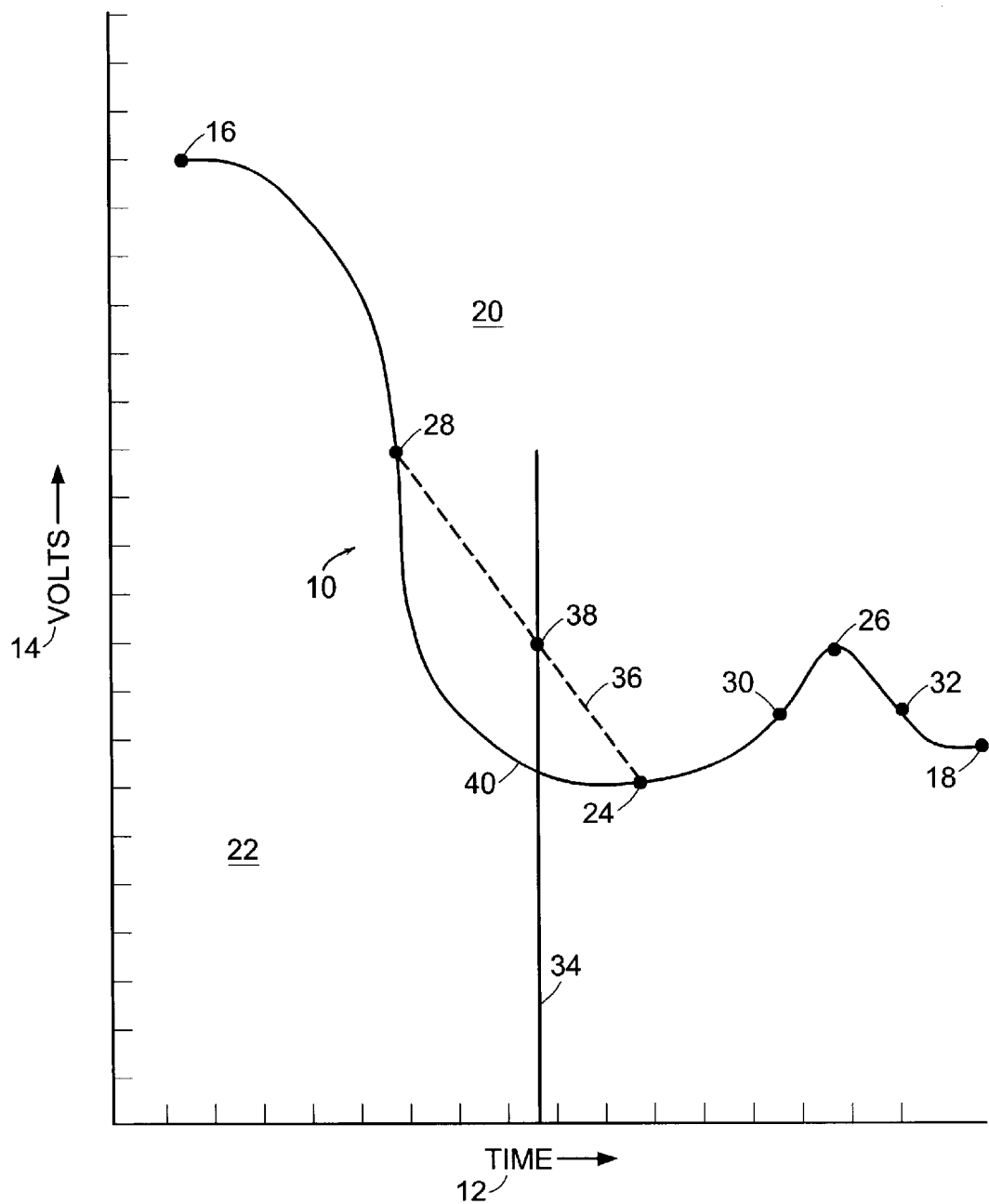
FIG. 1 is a graph of a curve in two variables.

In FIG. 1, a curve 10 represents a functional relationship in two variables. Curves of the general type of curve 10 may represent any sort of harmonic, oscillatory, damped harmonic, growth or decay curves or waveforms. Such curves may be used to represent physical behavior such as voltage changes in electronic devices, vibrations in mechanical structures, or the movement of masses on springs. A curve or waveform such as 10 may be either a continuous function as shown, or a piecewise linear curve of connected straight line segments. The line segments comprising a piecewise linear curve may have any length, with shorter line lengths and greater numbers of line segments tending to more closely approximate the value of a continuous curve. A horizontal axis 12 records one of the two variables, in this illustrative embodiment, representing time. A vertical axis 14 records the other variable, in this illustrative embodiment representing voltage on a electronic device. The curve has a defined starting or beginning point 16, and a defined ending point 18. The curve 10 breaks the area of the chart into two regions, region 20 to the right of the curve 10, and region 22 to the left. Using the two axes of the illustrative embodiment, the region 20 represents action of the electronic device that is later (i.e., slower) than that represented by the curve 10 over the first part of the curve, and the region 22 represents earlier (i.e., faster) electronic device action. This is true only of the falling part of the curve that runs from the starting point 16 to the first point 24 where the curve 10 becomes horizontal, or where the slope of curve 10 becomes zero. Point 24 may be found by setting the first derivative of the function of curve 10 equal to zero, or other means and methods as known in the art.

For the rising part of curve 10, from point 24 to point 26, where the first derivative is again zero, the roles of regions 20 and 22 reverse, and region 20 becomes the earlier (i.e., faster) operating region and region 22 becomes the later (i.e., slower) operating region for the rising curve. For the falling curve region between point 26 and the ending point 18, regions 20 and 22 revert back to their initial representations. Essentially, points to the right of any curve segment are slower, or later. Thus any open curve which is single valued in one of it variables (in this illustrative example the variable of time) may be simply partitioned into falling segments and rising segments.

Within each of the falling or rising segments of the curve 10, there may be more than one direction of curvature. The illustrative embodiment shows two curvatures for each of the segments of curve 10. The first falling segment, from 16 to 24, begins as a convex right curve, i.e., with the convex portion pointing toward the right at region 20, which in this example represents later electronic action. The convex section ends at inflection point 28, and the curve continues as a concave right curve, which may also be called convex left, to point 24. The inflection point 28 may be found by setting the second derivative of the function of curve 10 to zero, or by other means and methods.

The second segment of curve 10, running from point 24 to point 26, is a rising curve, again having a concave portion and a convex portion. The inflection point 30 defines the boundary of the convex right section of the curve from the concave right section of the rising curve segment of curve 10.

The second falling curve segment of curve 10 runs from point 26 to the ending point 18, and again has a convex right portion extending to inflection point 32, and a concave right portion extending to the end point 18. In all cases the inflection points 28, 30 and 32 may be found by setting the second derivative equal to zero, or other methods of examining changes in slope.

The above described method of breaking up complex curves into rising and falling segments, and into concave and convex sections, may be applied to any single valued curve having two variables, and serves to simplify the analysis of the curve and the compression of the curve data into a more easily stored form. A typical method of representing either a continuous curve function or a very fine piecewise curve numerically is to approximate the curve by drawing a series of straight line segments between points spaced on the curve, and storing the location of the points in memory. While a waveform such as curve 10 may require several hundred sets of points to store the curve data accurately, thus resulting in a high requirement for storage memory, a piecewise approximation of the curve 10 may have only 20 sets of points to store and to use in calculations, thus resulting in improved calculation speed, but at the expense of reduced accuracy. In general, the more individual points of the curve that are stored, the better the accuracy, but the slower the calculation. Clearly the placement of the points is very important. For example, a 20 point approximation of a waveform may have more error than a 10 point approximation if the 20 points are not optimally placed.

For example, imagine using the numbered points on curve 10 as the end points of line segments intended to approximate the value of curve 10. The amount of storage has clearly been reduced since only 7 points need to be stored, but the deviation between the value of curve 10 at some time point 34 on horizontal axis 12, and the value of the line segment at that same time point may be large, leading to inaccuracy in calculations using the compressed data. The dotted line 36, between point 28 and point 24 on curve 10, has a value 38 at time 34, while the curve 10 has a very different value 40 at the same time. Therefore, calculations using the approximate line 36 to represent the value of curve 10 will introduce unacceptable errors. In this example the error introduced was in region 20, and thus represents a later operation of an electronic device than the correct value as represented by curve 10. However, the direction or the sign of the introduced error is not always the same, as can be seen by drawing a straight line between point 16 and point 28. In that region the approximation introduces an error toward the faster or earlier region 22. Clearly the more points that are used to draw the straight line approximations the better the accuracy, assuming proper point placement, and the more storage memory is required. Each application will have its own balance between speed and accuracy.

There are certain applications where it is necessary that all of the error introduced by the approximation and compression of the data of curve 10 be either on the late side, or on the early side. As mentioned previously, region 20 is not always the late side. An example of such an application is calculating the maximum time that a signal will take to traverse a series of electronic devices, each one having a known voltage versus time behavior represented by a function having a curve such as curve 10. It is necessary to ensure that all points of the first falling section (between points 16 and 24) of the compressed data of curve 10 be located in region 20, i.e., the late operation region to the right, in order to ensure that the overall calculation results in a true maximum time for signal propagation. Other examples of max/min strengths, or structural flexion, exist that have the same requirement that all of the compression error to be on one side or the other of the original curve. What is typically done in the art to ensure that all points are on one side, is to shift the entire compressed (i.e., the piecewise linear line segments) curve over toward the desired side by at least the maximum possible error, thus resulting in a true maximum, or minimum, calculation.

Figure 2:
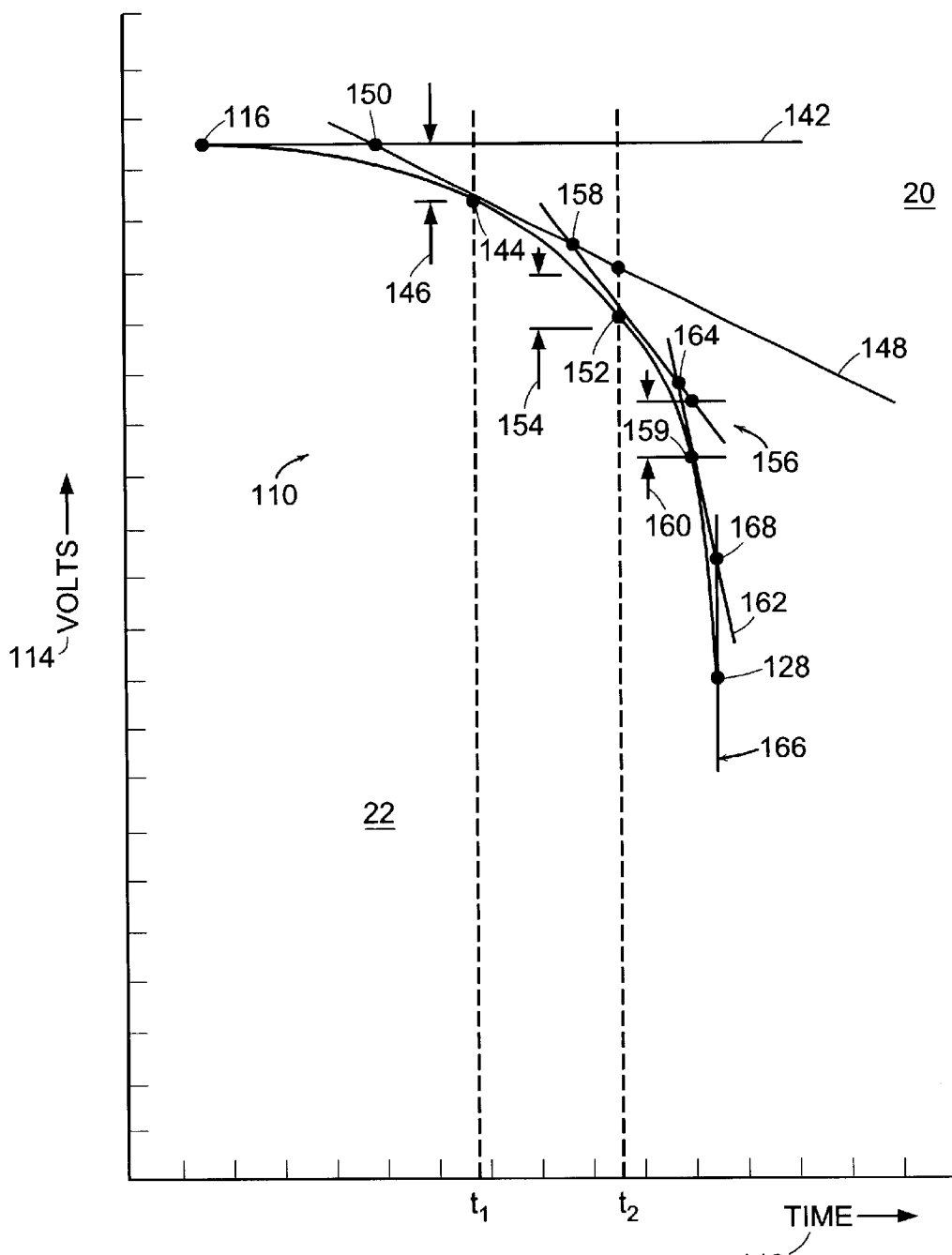
FIG. 2 is a graph of the compression of a falling convex curve, in accordance with the invention.

In FIG. 2, a falling curve section 110, having a horizontal variable axis 112, in this illustrative embodiment representing time, and a vertical variable axis 114, representing electronic device voltage levels, is convex right. The curve 110 has a beginning point 116 and an ending point 128, which corresponds to inflection point 28 of FIG. 1 where the second derivative of curve 10 was equal to zero. Assuming for the present example that the desired direction in which to confine the compression error is toward the right, in this example the late side, a tangent 142 line (in this illustrative embodiment happening to be horizontal) is drawn from point 116. Following the curve 110 in the direction of increasing time, at a time t1 a point 144 is found where the difference in value between the curve 110 and tangent 142 is equal to a previously defined accuracy limit, 146. A new tangent line 148 is drawn to the curve 110 at point 144, and the intersection 150 of the two tangent lines is calculated and stored in a memory location in an ordered list along with the initial location 116. These two stored points, 116 and 150, are the end points of one of the linear line segments that will approximate the value of curve 110. Note that the maximum difference between the two lines of the stored approximation and the curve 110 is the difference between point 150 and the curve 110, which will be less than the defined accuracy limit 146.

Now starting from point 144 on the curve 110, and again proceeding toward increasing time in this illustrative embodiment, at a second time t2, point 152 on the curve 110 is reached, where the difference in value between tangent 148 and curve 110 again reaches the predetermined accuracy limit 154. Typically all of the predetermined accuracy limits will be equal to a single value for a given curve 110. In a preferred embodiment of the invention the accuracy limit is set at 150 millivolts. A new tangent 156 is drawn at point 152 and the intersection point 158 between tangents 152 and 148 is calculated and stored in the proper place on the ordered list. The straight line from 150 to 158 is the second line segment in the piecewise linear approximation and data compression of curve 110.

Following the procedure again results in point 159 where the value of the tangent 156 differs from curve 110 by a predetermined accuracy limit 160 and a new tangent line 162 drawn at point 159. The intersection point 164 between tangents 162 and 156 is again stored in the ordered list of end points of linear segments.

Finally, a tangent 166 is drawn through inflection or ending point 128. The intersection point 168 and ending or inflection point 128 are recorded in the ordered list.

Thus the curve 110 is data compressed and approximated by the six points 116, 150, 158, 164, 168 and 128, which represent the end points of line segments, all of whose points are within a preset accuracy value of the curve 110, and all of whose points are on or to the right side of curve 110.

Figure 3:
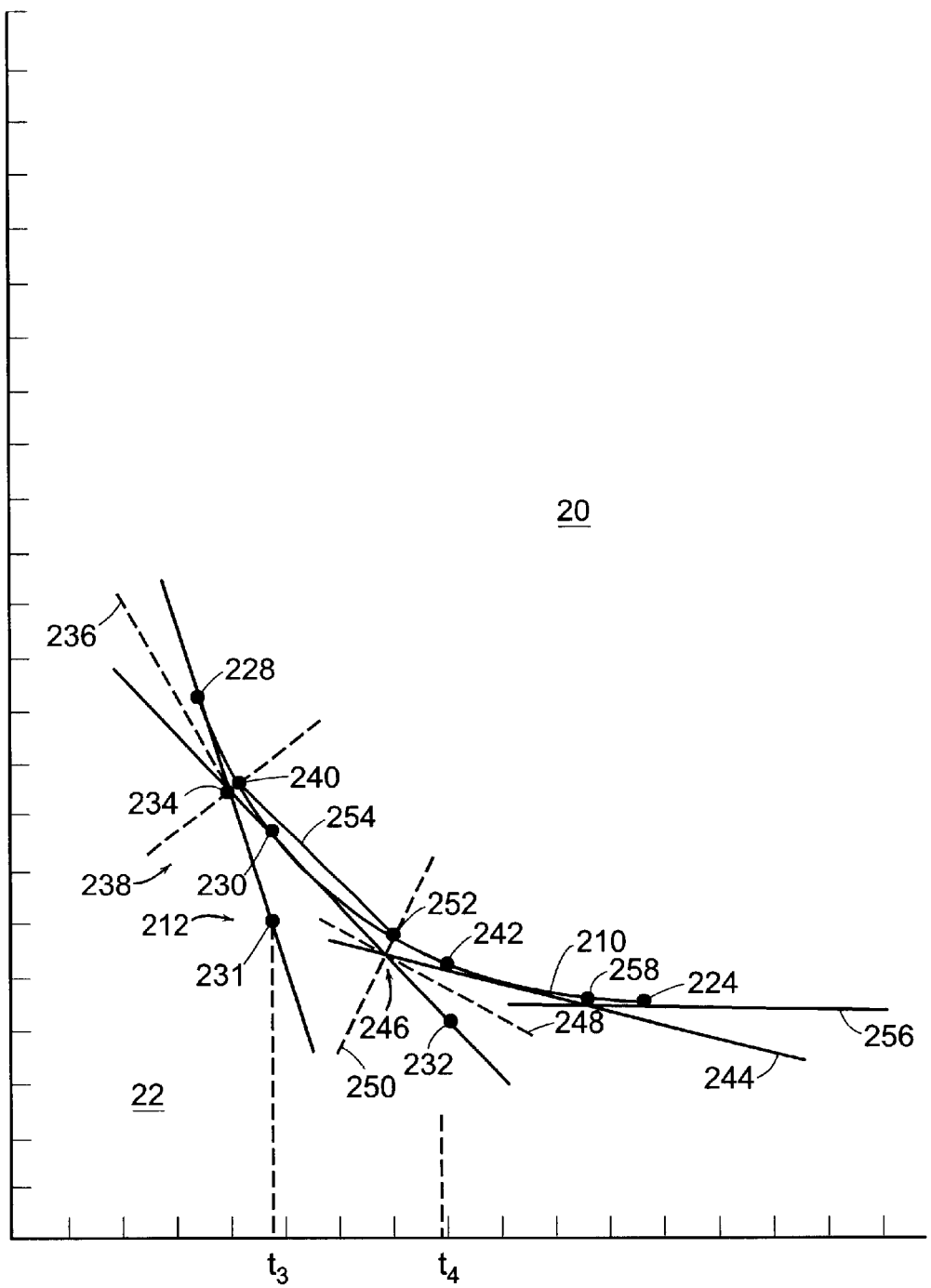
FIG. 3 is a graph of the compression of a falling concave curve, in accordance with the invention.

In FIG. 3, a falling concave right curve 210 has a starting point 228, which may also be an inflection point from a previous curve section, and a tangent line 212 constructed at point 228. The tangent 212 may also be the tangent line 166 from the previous section of the curve as shown in FIG. 2.

Again in this example, it is assumed that the error is to be confined to the right, or later, side of the curve. At a point 230 on curve 210 at a time t3, the difference in value between the curve 210 and the tangent 212 reaches the accuracy limit at point 231, and a new tangent line 232 to curve 210 is constructed at point 230. The intersection point 234 between tangents 232 and 212 is determined, and the point on curve 210 closest to intersection 234 is calculated and recorded, in this example point 240. In a preferred embodiment of the invention the point 240 is calculated by bisecting the angle between the tangents 232 and 212, resulting in dotted line 236. A line 238 is calculated perpendicular to bisection line 236. The intersection (i.e., point 240) of perpendicular line 236 and the curve 210 is calculated and recorded along with starting point 228 in an ordered list. Note that there are other possible methods for finding the closest point on the curve 210 to the intersection point 234. Points 228 and 240 are the end points of a straight line that approximates the curve 210 to within a preset accuracy value, with all of the values of the approximation on the right, i.e., the later or slower side of curve 210.

Continuing to follow curve 210 in the direction of increasing time value, a point 242 at a time value t4 is reached where the value of the curve 210 differs from the value of tangent 232 by the predetermined accuracy value. In the preferred embodiment of the invention all of the predetermined accuracy values will be the same. New tangent 244 is constructed at point 242, and the intersection 246 of tangents 232 and 244 is calculated. The angle between the tangents is calculated and bisecting dotted line 248 is used to calculate perpendicular dotted line 250. The intersection 252 of perpendicular line 250 and curve 210 is calculated and stored in the ordered list. The points 240 and 252 on the curve 210 are the end points of approximation line segment 254. Note again that all of the points on line 254 are either on curve 210, or are on the selected side of curve 210 to confine any compression errors and are within the preselected accuracy value 231.

The above described process is continued until the predefined end point or inflection point 224 is reached, in this example the point where the descending curve becomes horizontal, and begins to ascend. A tangent line 256 is constructed to curve 210 at the end point 224 and the intersection with tangent line 244 is calculated as before. The nearest point on curve 210 is point 258, and this point is recorded in the ordered list. If the point 224 is the endpoint of the entire curve to be data compressed, then the point 224 is recorded as the last entry in the ordered list.

The process of approximating and data compressing the value of the curves 110 and 210 as described above with reference to FIGS. 2 and 3, were discussed with the selected side upon which the compression error is to be confined being the right, or late side, region 20. The process is exactly the same for the case of confining the error to the left, or early side region 22, except that the curve section that was convex right becomes concave left, and thus the concave process of FIG. 3 would be performed first, and then followed by the second section of the curve, which is now convex left, performed as described in the FIG. 2 discussion.

Figure 4:
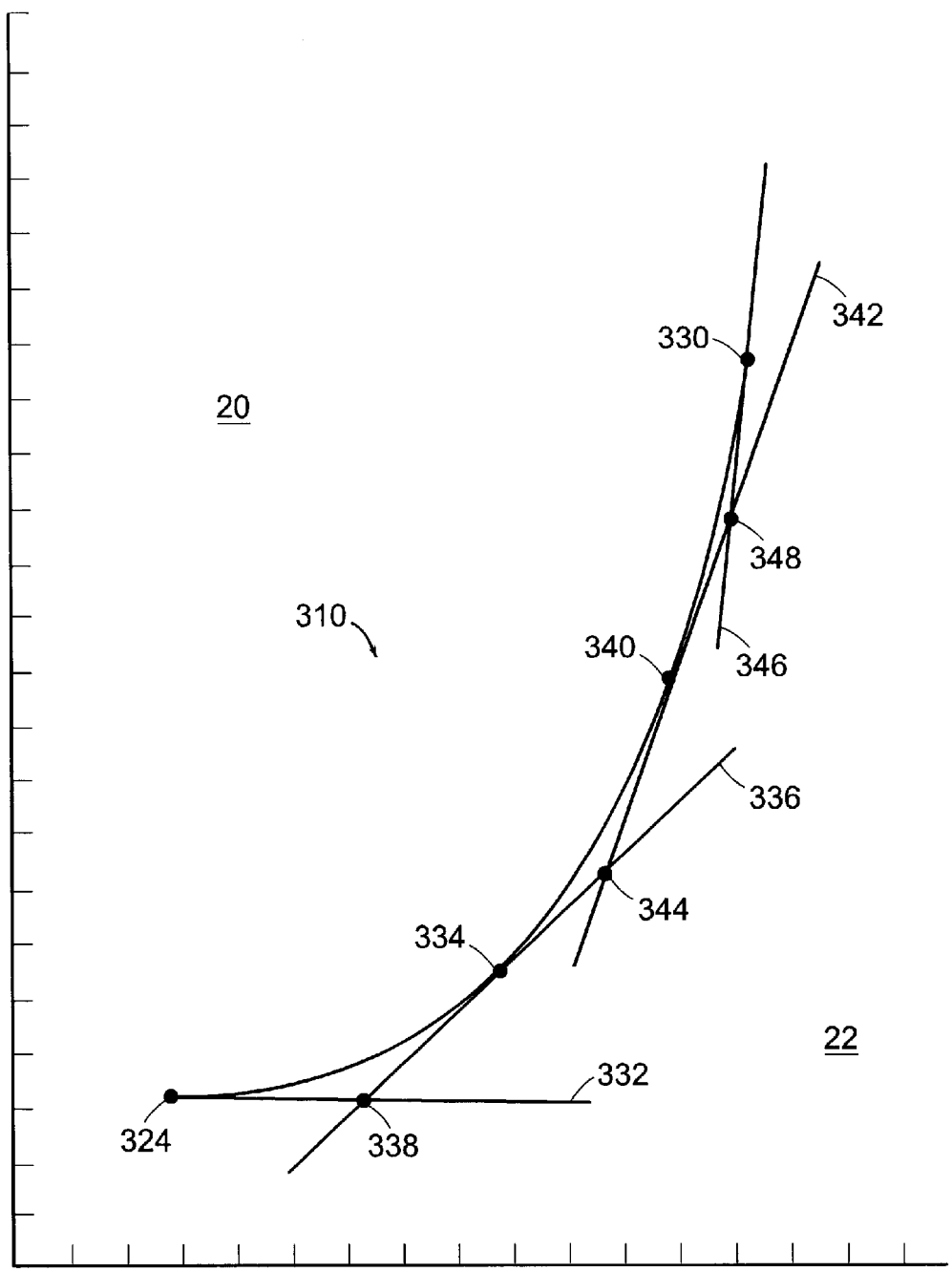
FIG. 4 is a graph of the compression of a rising convex curve, in accordance with the invention.

In FIG. 4, a rising curve section 310 has a starting point 324, which may also be the zero slope point of a previous curve segment, and an ending point 330, which may also be the inflection point for a subsequent curve section. The process as previously is used for approximating and data compressing the curve 310 with the error confined to the right, i.e., the later side, region 22. Note that the late side of the rising curve segment is now region 22 as opposed to region 20 as discussed above with reference to the falling curve segment. The rising curve 310 is a convex right curve section, and thus the process will be seen to be similar to that for the convex right falling curve of the FIG. 2 description.

Tangent 332 is constructed from point 324 and the point on curve 310 where the deviation reaches the predefined accuracy limit is 334. Tangent 336 is constructed at point 334 and the intersection 338 of tangents 332 and 336 is recorded in an ordered list as previously described. At point 340 on curve 310 the deviation from tangent line 336 exceeds the accuracy limit, tangent line 342 is constructed, and intersection point 344 is recorded in the ordered list. The predefined accuracy limit is not reached again before the ending point 330 of the curve section 310, and thus the last tangent line 346 is constructed at point 330, and the intersection point 348 and ending point 330 are recorded on the ordered list.

Again, note that the illustrative example is confining the compression error to the slow side of the curve 310, in region 22, and that all points on the line segments 324, 338, 344, 348 and 330 are either on curve 310, or on the selected side to confine error, and are within the predetermined accuracy value.

Figure 5:
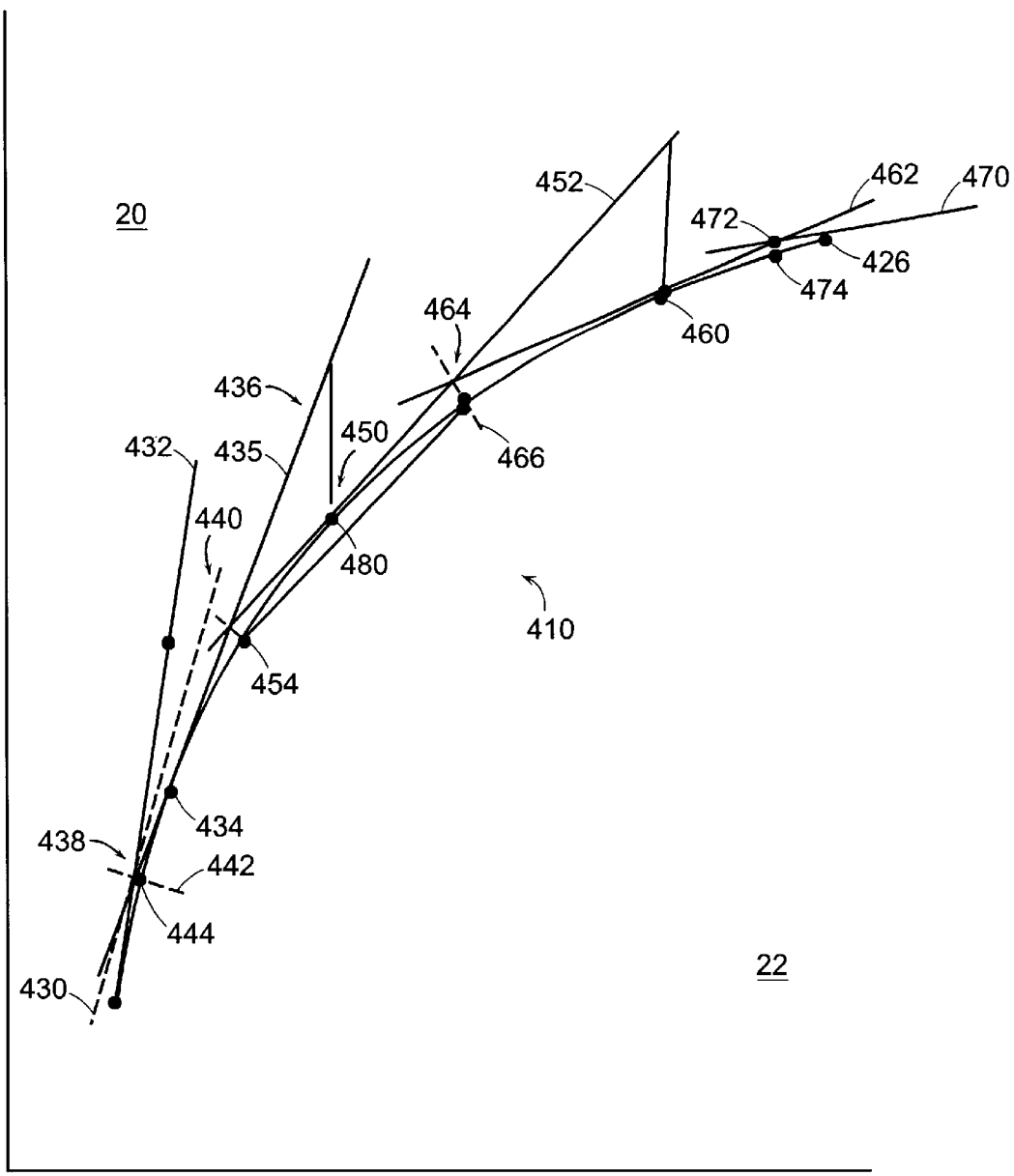
FIG. 5 is a graph of the compression of a rising concave curve, in accordance with the invention.

In FIG. 5, a concave right rising curve section 410 has a beginning point 430 and an ending point 426, either of which may be inflection points or zero slope points of preceding or subsequent curve sections. A tangent 432 is constructed at starting point 430. A new tangent line 436 is constructed at the point 434 on curve 410 where the deviation between the tangent 432 and the curve 410 reaches the accuracy limit, and the intersection 438 of the tangent line is found. The angle between the tangent lines is bisected with dotted line 440 and the perpendicular dotted line 442 is constructed. The intersection 444 of the line 442 and the curve 410 is recorded on the ordered list as one of the end points of the straight lines that approximate the curve 410.

At point 450 on curve 410 the accuracy limit is reached and new tangent 452 is constructed. The intersection 453 of tangents 452 and 436 is found, the angle bisected and the perpendicular line is found, and the point 454 on curve 410 is recorded in the ordered list. The process is repeated to find point 460, draw tangent 462, find intersection 464, and perpendicular point 466 on curve 410 is found and recorded.

The accuracy is not exceeded prior to reaching the end point 426 of the curve section 410, then a tangent 470 is constructed at end point 426, the intersection with tangent 462 is found at point 472, the nearest point on curve 410 is found at point 474 and is recorded in the ordered list along with the end point 426 and the process concludes. The stored points 430, 444, 454, 466, 474 and 426 are the end points of straight lines that approximate the curve 410 with only six sets of points, all within the defined accuracy limit and with all data points on the late side of the curve 410, in region 22. An exemplary straight line segment 480 is shown between stored points 454 and 466, and demonstrates that all points on the compressed data line segments will again be either on the curve 410, or on the desired side to confine compression errors.

Figure 6:
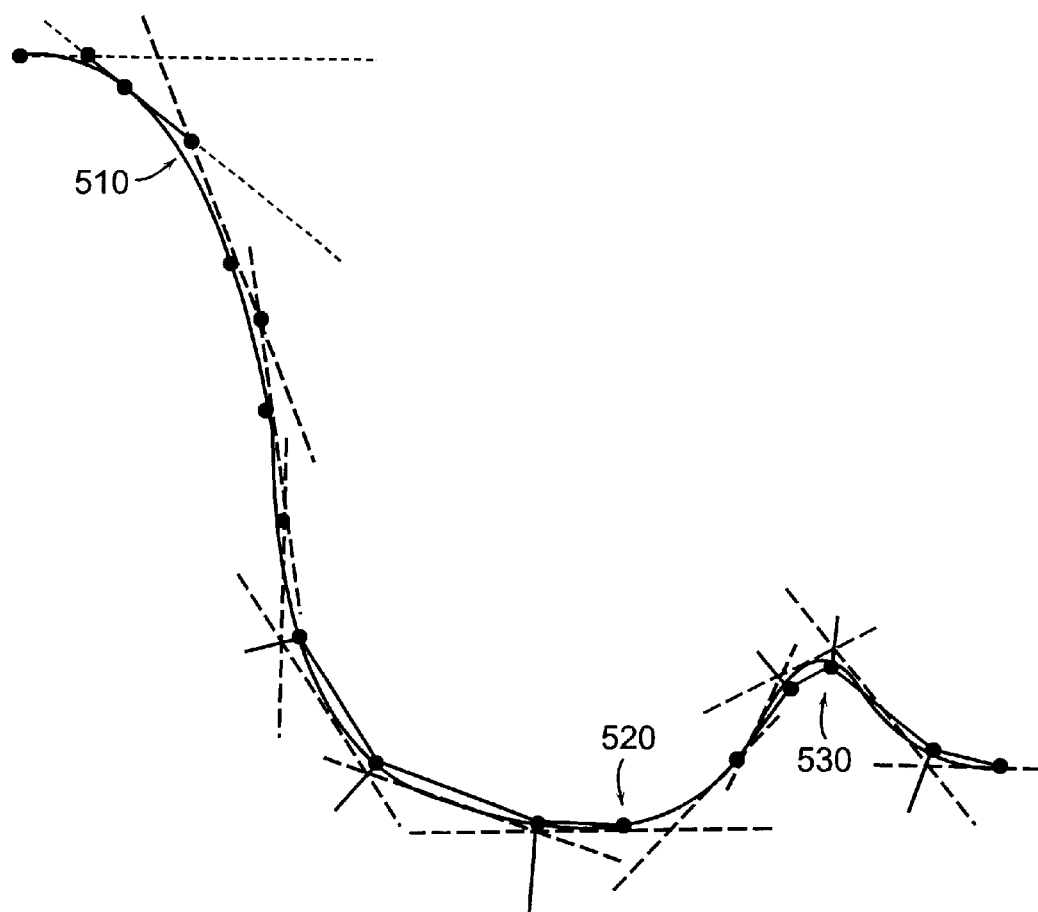
FIG. 6 is an overall view of the illustrative curve with the approximation points shown in accordance with the invention.

In FIG. 6, the entire curve is shown with the approximation line segments discussed and shown above with reference to FIGS. 1–5. Note that the side to which the error is confined is always to the right side of the curve 510 for the illustrative example of late electronic response. Also notice that the late approximation line segments cross over the curve 510 at points 520 and 530. The curve tangents are shown as dotted lines and the approximation line segment end points are shown as bold dots. The compression method records the endpoint values as an accurate representation of the entire curve, with a consequent compression ratio of greater than 300%.

Using the above-described process of dividing a curve into rising and falling segments, and the segments into convex and concave sections, an automatic method of curve data compression with predetermined accuracy and with all of the compression error confined to a chosen side of the curve may be obtained. The method requires that a starting point, an ending point, at least one accuracy limit, and a chosen side upon which to confine any data compression error be provided. The method also requires that the curve to be data compressed be single valued in at least one of the two variables, i.e., it must have no locations where the curves loops or contacts itself. A specific example is the voltage versus time relationship of an electronic device such as a logic gate. The logic gate will not have two different voltage values at any single time point, and it thus single valued with respect to time.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of providing a piecewise compression approximation of a two dimensional curve, comprising the steps of:
   selecting a side of a curve to which all approximation errors are to be constrained;
   computing line segments to approximate the curve, all points of the line segments being entirely on the curve or to the selected side of the curve;
   in any section of the curve which is convex toward the selected side, computing line segments, each having a single point on the curve, to approximate the curve; and
   in any section of the curve which is concave toward the selected side, computing line segments, each having end points on the curve, to approximate the curve.

2. The method of claim 1, wherein all points on the computed line segments are further within a predetermined accuracy value of the curve.

3. The method of claim 1 wherein each of the line segments having a single point on the curve is tangential to the curve at that single point.

4. The method of claim 1 wherein one of the two dimensions of the curve is time, and the selected side to which all approximation errors are to be constrained is the side of the curve which is toward increased time.

5. The method of claim 1 wherein one of the two dimensions of the curve is time, and the selected side to which all approximation errors are to be constrained is the side of the curve which is toward decreased time.

6. A method of data compression, comprising the steps of:
   selecting one side of a curve to confine compression error;
   partitioning the curve into rising and falling segments;
   partitioning the curve segments into convex and concave sections toward the selected side;
   storing in a memory the intersection locations of tangent lines drawn on the selected side of the convex sections of the curve; and
   storing the locations on the curve closest to the intersection locations of tangent lines drawn on the non selected side of the concave sections of the curve.

7. The method of claim 6 where a difference in value between the tangent lines and the curve is calculated, and a new tangent line is calculated at the point of the curve where the difference in value is greater than a predetermined value.

8. The method of claim 6 where the method for partitioning the curve into rising and falling segments comprises calculating the first derivative of the curve and determining the difference in value between points on the curve where the first derivative is equal to zero.

9. The method of claim 8 where the method for partitioning the curve segments into convex and concave sections comprises calculating the second derivative of the curve and determining the sign of the direction of change in the value of the first derivative of the curve.

10. A method of data compressing curves having two variables such that the compression error occurs only on a selected side of the curve, comprising the steps of:
    determining a beginning point and an ending point on a curve;
    determining upon which side of the curve to confine a compression error;
    calculating the first derivative and the second derivative for the curve;
    calculating the points on the curve where the first derivative is equal to zero;
    dividing the curve into falling and rising segments;
    calculating the points on each of the curve segments where the second derivative is equal to zero;
    creating a first ordered list of points having the first and second derivatives equal to zero, including and starting with the determined beginning point of the curve, and including and ending with the determined ending point of the curve;
    determining which of the curve sections between each of the points of the first ordered list are convex shaped toward the selected side of the curve to confine the error;
    determining which of the curve sections between each of the points of the first ordered list are concave shaped toward the selected side of the curve to confine the error;
    starting at the determined beginning point of the curve and continuing until the determined ending point, constructing a piecewise linear approximation of the curve with all of the linear segments on the selected side of the curve to confine the error; and
    storing a second ordered list of the locations in the two variables for the starting point, intersection points of the linear segments, and the ending point in a memory storage location.

11. The method of claim 10 wherein the method to determine if the curve segment is a rising segment toward the selected side further comprises;
    starting with the beginning point of the curve segment, finding a first point having a first derivative equal to zero and subtracting the value of the first point from the value of the beginning point;
    if the value of the difference is greater than zero, then the curve segment is a rising segment.

12. The method of claim 11 wherein the method to determine if a falling curve section is convex toward the selected side further comprises:
    calculating the value of the second derivative between the beginning and ending point of the curve section from the ordered list of points having either the first or second derivatives equal to zero;
    if the value of the second derivative is negative then the falling curve section is convex toward the right.

13. The method of claim 10 wherein the method to construct the piecewise linear approximation of the curve further comprises:

if the curve section has been determined to be convex toward the selected side to confine the error, construct a tangent line to the first point on the curve section;

at the point on the curve where the difference in value between the tangent and the curve exceeds a predetermined accuracy value, construct a new tangent line and record the location where the new tangent line intersects the prior tangent line;

repeat until the point where the second derivative is equal to zero is reached;

if the curve section has been determined to be concave toward the selected side to confine the error, construct a tangent line to the first point on the curve section;

at the point on the curve where the difference in value between the tangent and the curve exceeds the predetermined accuracy value, construct a new tangent line and determine the location where the new tangent line intersects the prior tangent line;

determine the angle formed between the two tangent lines, bisect the angle and calculate the perpendicular line to the bisecting line;

record the point on the curve where the perpendicular line intersects; and repeat until the ending point of the curve is reached.

14. The method of claim 10 where the two variables are time and voltage.

15. The method of claim 13 where the predetermined accuracy value is 0.15 volts.

16. A method of data compression for open single valued rising time dependent curves, comprising the steps of:

selecting which side of a curve to confine compression error;

partitioning the curve into convex and concave sections toward the selected side;

storing in a memory the intersection locations of tangent lines drawn on the selected side of the convex sections of the curve; and storing the locations on the curve closest to the intersection locations of tangent lines drawn on the non-selected side of the concave sections of the curve.

17. The method of claim 16 where the curve is an open single valued falling time dependent curve.

18. The method of claim 16 where the method for partitioning the curve into convex and concave sections comprises calculating the first and second derivatives of the curve, defining starting and ending points for the curve, determining the sign of the direction of change in the value of the first derivative of the curve between the starting point and the point on the curve where the second derivative is equal to zero, and determining the sign of the direction of change in the value of the first derivative of the curve between the ending point and the point on the curve where the second derivative is equal to zero.

19. A computer programmed to data compress a curve with all of the compressed data points confined to a selected side of the curve, comprising:

means for selecting which side of a curve to confine compression error;

means for partitioning the curve into rising and falling segments;

means for partitioning the curve segments into convex and concave sections;

means for storing in a memory the intersection locations of tangent lines drawn on the selected side of the convex portions of the curve; and means for storing the locations on the curve closest to the intersection locations of tangent lines drawn on the non-selected side of the concave portions of the curve.

20. The computer of claim 19 wherein the means for partitioning the curve into rising and falling segments further comprises means for calculating the first derivative of the curve and determining the difference in value between points on the curve where the first derivative is equal to zero.

21. The computer of claim 19 wherein the means for partitioning the curve segments into convex and concave sections further comprises means for calculating the second derivative of the curve and determining the sign of the direction of change in the value of the first derivative of the curve.

22. The computer of claim 19 where the difference in value between the tangent lines and the curve is less than a predetermined accuracy value.

23. The computer of claim 19 where the curve to be data compressed is a measured value of a time dependent harmonic function which is single valued at all points in time.

24. The computer of claim 19 where the curve to be data compressed is a functional representation of the time dependent logic response of an electronic circuit.

25. A circuit timing verification tool programmed to data compress a two dimensional curve representing the time versus voltage behavior of the circuit with all of the compressed data points confined to a selected side of the curve, comprising:

inputs for selecting which side of a curve to confine compression error;

inputs for defining a maximum allowable deviation from the curve value;

inputs for defining the beginning and ending points of the curve;

partitioning the curve into rising and falling segments using the beginning point, the ending point and points on the curve where the first derivative is equal to zero;

partitioning the curve segments into convex and concave sections toward the selected side by setting the second derivative of the curve equal to zero;

storing in a memory the intersection locations of tangent lines drawn on the selected side of the convex portions of the curve; and storing the locations on the curve closest to the intersection of tangent lines drawn on the non-selected side of the concave portions of the curve.

26. The timing verification tool of claim 25 wherein partitioning the curve into rising and falling segments comprises means for calculating the difference in value between the beginning point and a next point on the curve where the curve slope is equal to zero.

27. The timing verification tool of claim 25 wherein partitioning the curve segments into convex and concave sections comprises calculating the sign of the direction of change in the value of the slope of the curve.

28. The timing verification tool of claim 25 where the difference in value between the tangent lines and the curve is less than a predetermined accuracy value.

29. The timing verification tool of claim 25 where the curve to be data compressed is a measured value of a time dependent electronic circuit function which is single valued at all points in time.

30. The timing verification tool of claim 25 where the curve to be data compressed is a calculated functional representation of the time dependent logic response of an electronic circuit.

31. The timing verification tool of claim 25 wherein the locations stored in memory are shifted towards increased time by a predetermined amount.

* * * * *